United States Patent
Nagar et al.

(10) Patent No.: US 8,081,484 B2
(45) Date of Patent: Dec. 20, 2011

(54) METHOD AND APPARATUS FOR SUPPORTING A COMPUTER CHIP ON A PRINTED CIRCUIT BOARD ASSEMBLY

(75) Inventors: Mohan R. Nagar, Cupertino, CA (US); Kuo-Chuan Liu, Fremont, CA (US); Mudasir Ahmad, Santa Clara, CA (US); Bangalore J. Shanker, Fremont, CA (US); Jie Xue, Dublin, CA (US)

(73) Assignee: Cisco Technology, Inc., San Jose, CA (US)

( * ) Notice: Subject to any disclaimer, the term of this patent is extended or adjusted under 35 U.S.C. 154(b) by 804 days.

(21) Appl. No.: 11/606,750

(22) Filed: Nov. 30, 2006

(65) Prior Publication Data

US 2008/0130241 A1 Jun. 5, 2008

(51) Int. Cl.
*H05K 7/20* (2006.01)
(52) U.S. Cl. ........ 361/760; 361/761; 361/762; 361/763; 361/764; 257/778; 257/780
(58) Field of Classification Search .................. 361/719, 361/720, 736, 748, 783, 760–764; 257/E21.503, 257/787, E23.001, 678, 684, 687, 690, 734, 257/737, 738, E23.021, E23.069, 506, 760, 257/778–780; 438/106, 400
See application file for complete search history.

(56) References Cited

U.S. PATENT DOCUMENTS

| | | | |
|---|---|---|---|
| 6,452,267 B1 * | 9/2002 | LeClair et al. | 257/728 |
| 6,614,122 B1 * | 9/2003 | Dory et al. | 257/787 |
| 6,744,640 B2 * | 6/2004 | Reis et al. | 361/818 |
| 6,963,142 B2 * | 11/2005 | Bolken | 257/797 |
| 7,361,972 B2 | 4/2008 | Chen | |
| 7,361,990 B2 | 4/2008 | Lu et al. | |
| 7,368,817 B2 | 5/2008 | Pendse | |
| 2005/0195582 A1 * | 9/2005 | Landeros et al. | 361/760 |
| 2007/0045870 A1 * | 3/2007 | Kuramochi | 257/782 |
| 2007/0284727 A1 * | 12/2007 | Liao et al. | 257/700 |

* cited by examiner

*Primary Examiner* — Ha Tran T Nguyen
*Assistant Examiner* — Suberr Chi
(74) *Attorney, Agent, or Firm* — BainwoodHuang

(57) ABSTRACT

A printed circuit board assembly and method of assembly in which underfill is placed between a chip and substrate to support the chip. A trench is formed in the upper layer of the printed circuit board to limit the flow of the underfill and in particular to limit the underfill from contact with adjacent components so that the underfill does not interfere with adjacent components on the printed circuit board assembly.

13 Claims, 8 Drawing Sheets

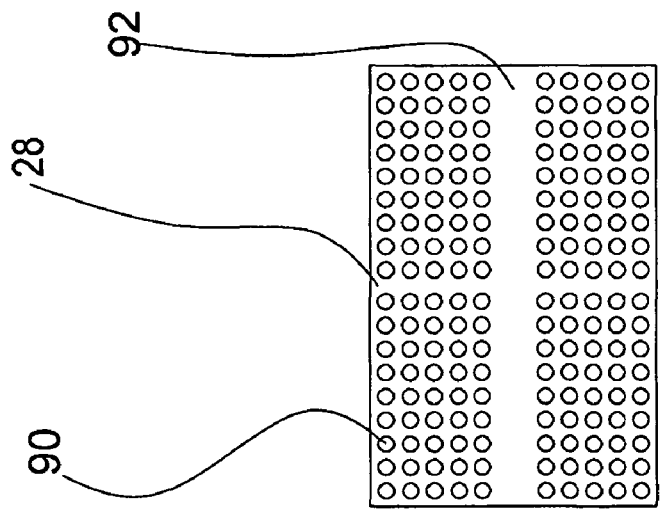
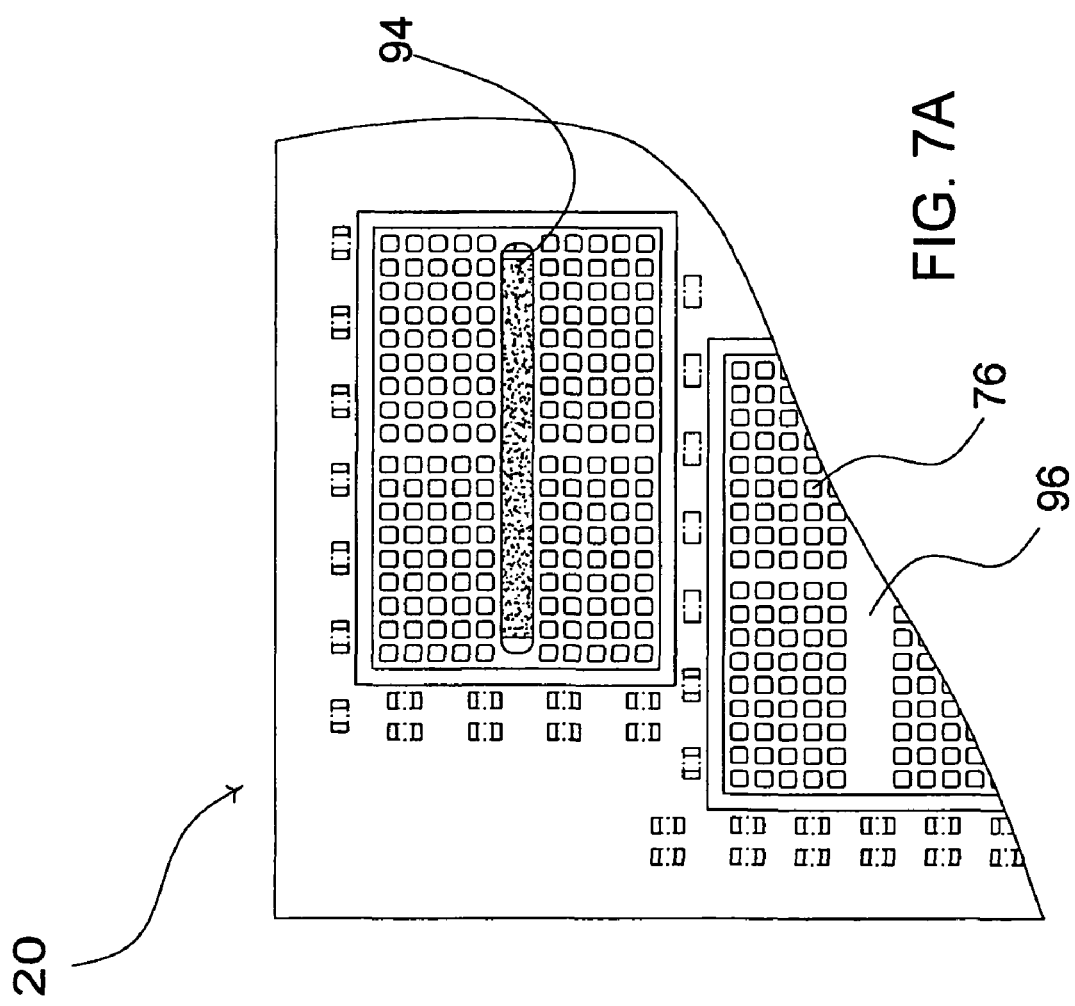
FIG. 7B
FIG. 7A

METHOD AND APPARATUS FOR SUPPORTING A COMPUTER CHIP ON A PRINTED CIRCUIT BOARD ASSEMBLY

BACKGROUND

Printed circuit board assemblies (PCBAs) are used in numerous equipment including computers, telephones, major appliances, vehicles such as automobiles, trains, and planes, and toys, etc. The printed circuit boards (PCBs) are getting more crowded with items such as integrated circuits, resistors, heat sinks, and other components.

A series of processes is required to create the printed circuit board and add the components to the printed circuit board to create the completed printed circuit board assembly. One of the steps is the mounting of a plurality of components to the printed circuit board. Some of the components are computer chips. Computer chips are typically mounted by a solder joint, such as ball grid array, that functions as both the electrical connection and the mechanical connection.

It is not uncommon for printed circuit board assemblies to vary in temperature through out the life of the assembly. This heating and cooling results in thermal stress between the component such as the chip or silicon device and the underlying substrate, the printed circuit board.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 7A is a top view of a portion of the printed circuit board without components showing a plurality of pads;

FIG. 7B is a bottom view of a chip; and

DETAILED DESCRIPTION

Overview

Figure 1:
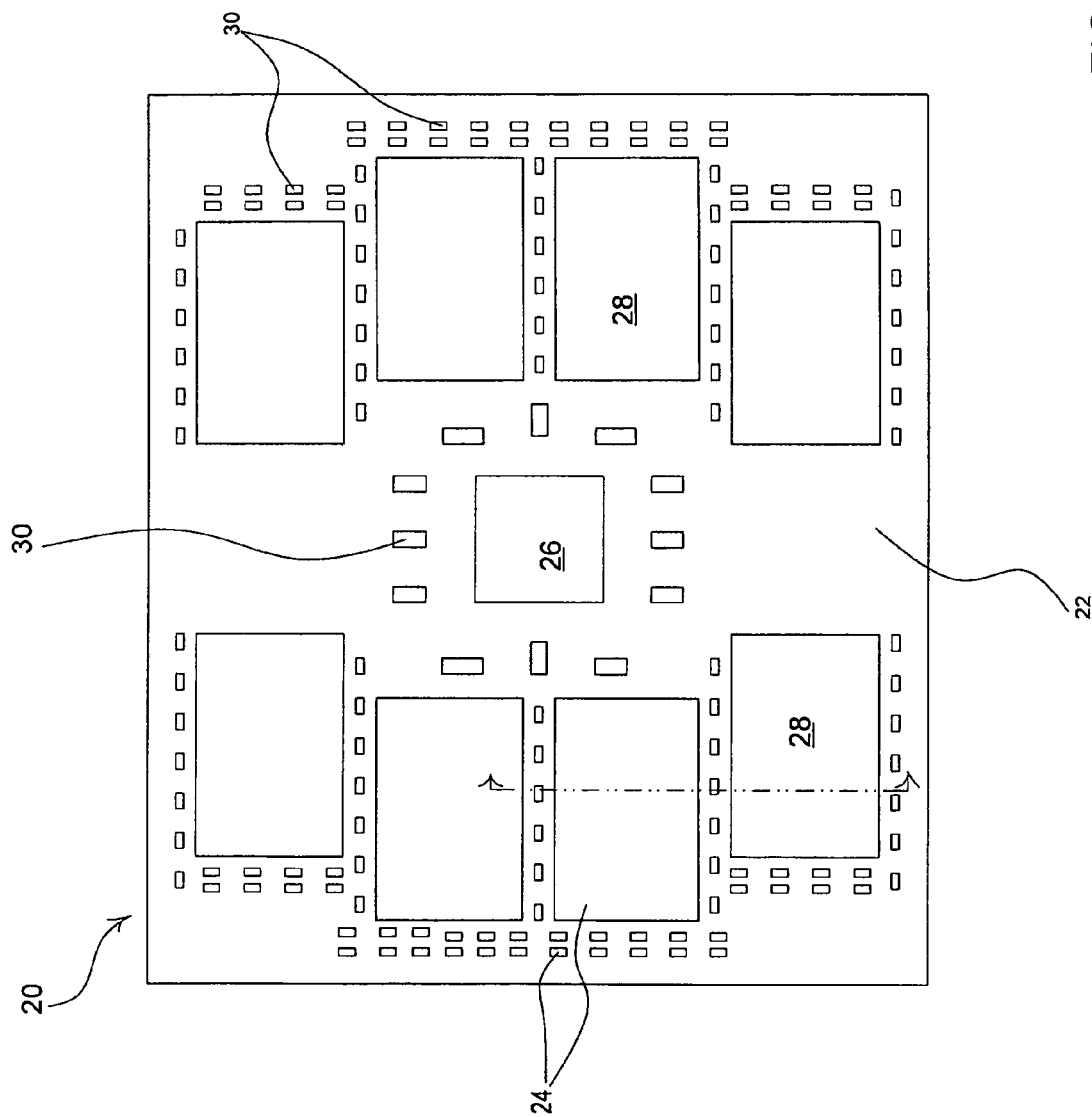
FIG. 1 is a top view of a printed circuit board assembly.

Unfortunately, the thermal stress can result in stress fractures in the solder joints. These stress fractures in the solder joint result in faults including intermittent connection and increased resistance. The component could separate entirely from the printed circuit board assembly and cause additional damage.

In contrast to the above-identified conventional method of securing the chip, it has been recognized that in addition to securing the chip to the printed circuit board with the solder joints, the chip can be secured using an underfill between the chip and the PCB to secure the chip. The improved printed circuit board assembly and method of assembly to place an underfill between a chip and the substrate to support the chip and concurrently limit the underfill so that it does not interfere with adjacent components on the printed circuit board assembly. The printed circuit board assembly has a trench to limit the flow of the underfill from flowing in contact with adjacent components. Accordingly, the conventional approach where the solder joint fractures or there is an increased likelihood of underfill flowing into contact with and degrading the component does not occur.

One embodiment is a printed circuit board assembly having a circuit board substrate. The board substrate has a plurality of mounting points for receiving electrical components including at least one chip and an adjacent component. An underfill material is interposed between the chip and the board substrate to assist in securing the chip to the board substrate such that the underfill improves reliability of the solder joint between the chip and the printed circuit board. A barrier is carried by the circuit board substrate to limit the flow of the underfill such that the underfill does not interact with adjacent components.

In one embodiment, the barrier is a trench formed in the substrate. In an embodiment, the trench formed in the board substrate is positioned to encircle the foot print of the chip. In another embodiment, the trench formed in the board substrate is positioned to underlie the chip with at least one underfill receiving portion located within the trench and extending outward from under the chip. In another embodiment, the trench formed in the board substrate is positioned to underlie the chip on at least two edges of the chip that are mounted to the board.

In one embodiment, the underfill underlies the chip around the circumference of the chip. In one embodiment, the underfill has a strip generally underlying the centerline of the chip. In another embodiment, the underfill underlies the entire chip.

In an embodiment, the underfill is an epoxy. In an embodiment, a heat shield overlies the electrical components.

One method of mounting a plurality of electrical components to a printed circuit board limits stress on the solder joints. A trench is formed in a printed circuit board. At least one chip is positioned on the printed circuit board. The chip is secured to the printed circuit board by solder joints. An underfill is dispensed on the printed circuit board in proximity to the chip. The underfill is drawn under at least one chip by capillary effect. The flow of the underfill is limited from flowing to adjacent components by the trench.

In one embodiment, the trench is formed in a mask. The mask is referred to as the solder mask over bare copper. In one embodiment, the underfill is an epoxy and is dried by the heat of adding additional components.

In one embodiment, a heat shield is installed overlying the components to remove heat from the component. In one embodiment, additional underfill is placed on the printed circuit board prior to positioning at least one chip on the printed circuit board.

DESCRIPTION OF EXAMPLE EMBODIMENTS

Referring to FIG. 1, a top view of a printed circuit board assembly 20 is shown. The assembly 20 has a printed circuit board 22 with various components 24 including a silicon die 26, a plurality of chips 28, and a plurality of capacitors 30. The various components 24 are secured to the printed circuit board 22 in various steps as discussed below in more detail.

Figure 2:
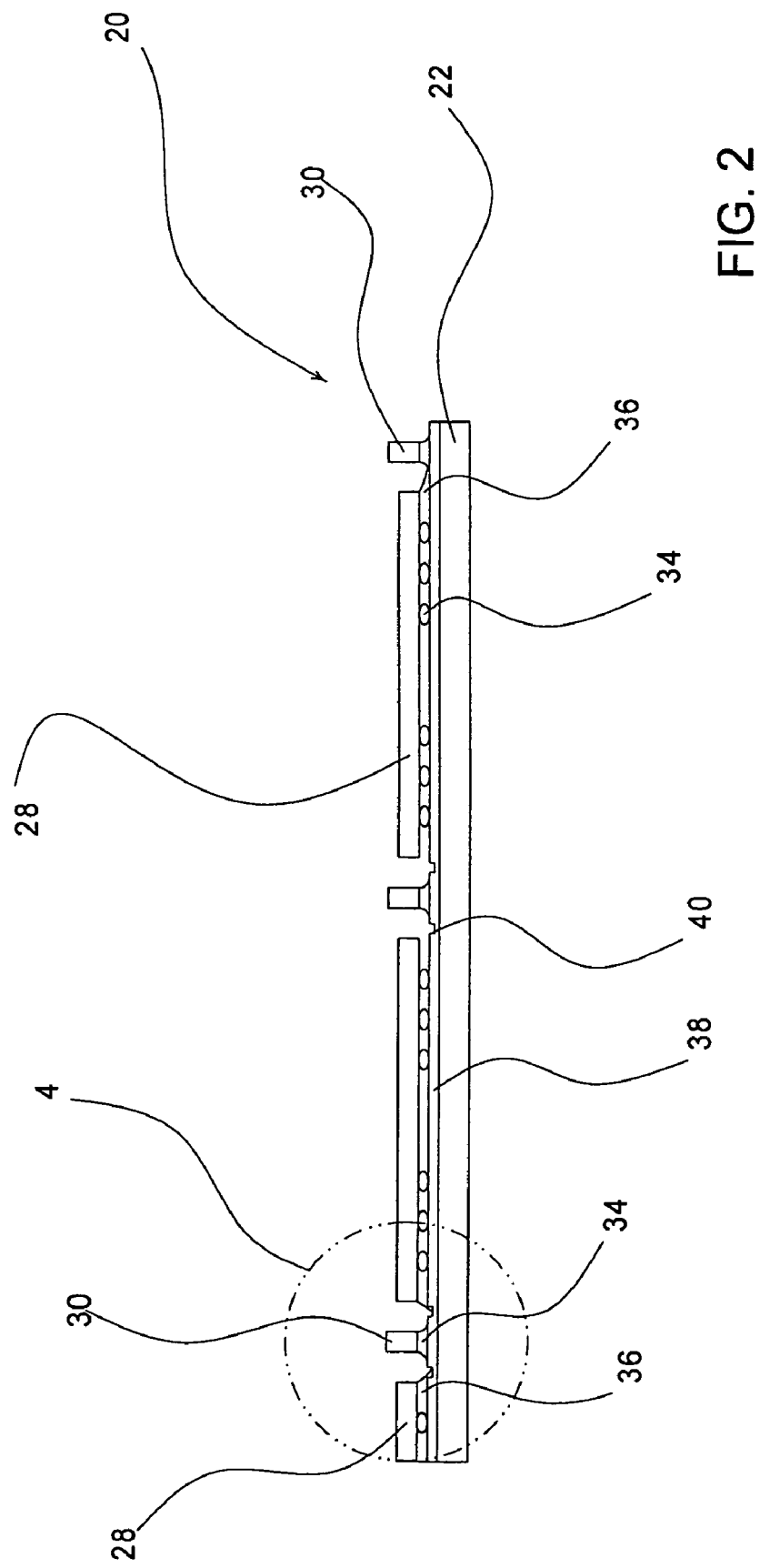
FIG. 2 is a side sectional view taken of the printed circuit board assembly along the line 2-2 of FIG. 1.

Referring to FIG. 2 is a side sectional view of the printed circuit board assembly 20 showing a plurality of chips 28 and a plurality of capacitors 30. The chips 28 are secured to the printed circuit board 22 by a plurality of solder joints 34. The solder joints 34 both provide electrical conductivity and structural support for the chips 28.

During the life of the printed circuit board assembly 20, the assembly 20 goes through various service conditions which may include thermal cycling. Thermal cycling can result in strain on the solder joint 34 because of differences in thermal expansion between the printed circuit board 22 and the component 24 such as a chip 28. The placing of a material, an underfill, 36 between the chip 28 and the printed circuit board 22 minimizes the stress and therefore can increase the life of the joint 34 and the life of the printed circuit board assembly 20.

Still referring to FIG. 2, the printed circuit board assembly 20 has the underfill 36 interposed between a top layer 38 of the printed circuit board 22, such as a solder mask over bare copper (SMOBC) layer, and the chip 28 to assist in the structural support of the chip 28.

The printed circuit board 22 has a trench 40 that is formed in the top layer 38. The trench 40 stops the flow of the underfill 36 from reaching the capacitors 30. Still referring to FIG. 2, no trench 40 is shown formed in the top layer 38 of the printed circuit board 22 in the space between the chip 28 and the capacitor 30 on the right side of the figure. The underfill 36 is shown touching the capacitor 30, which is not desired.

The underfill 36 touching components 24 such as capacitors 30, as in conventional methods, can adversely effect the mounting and/or operation of the components including increasing the likelihood of moisture damage or creating an open circuit.

Figure 3:
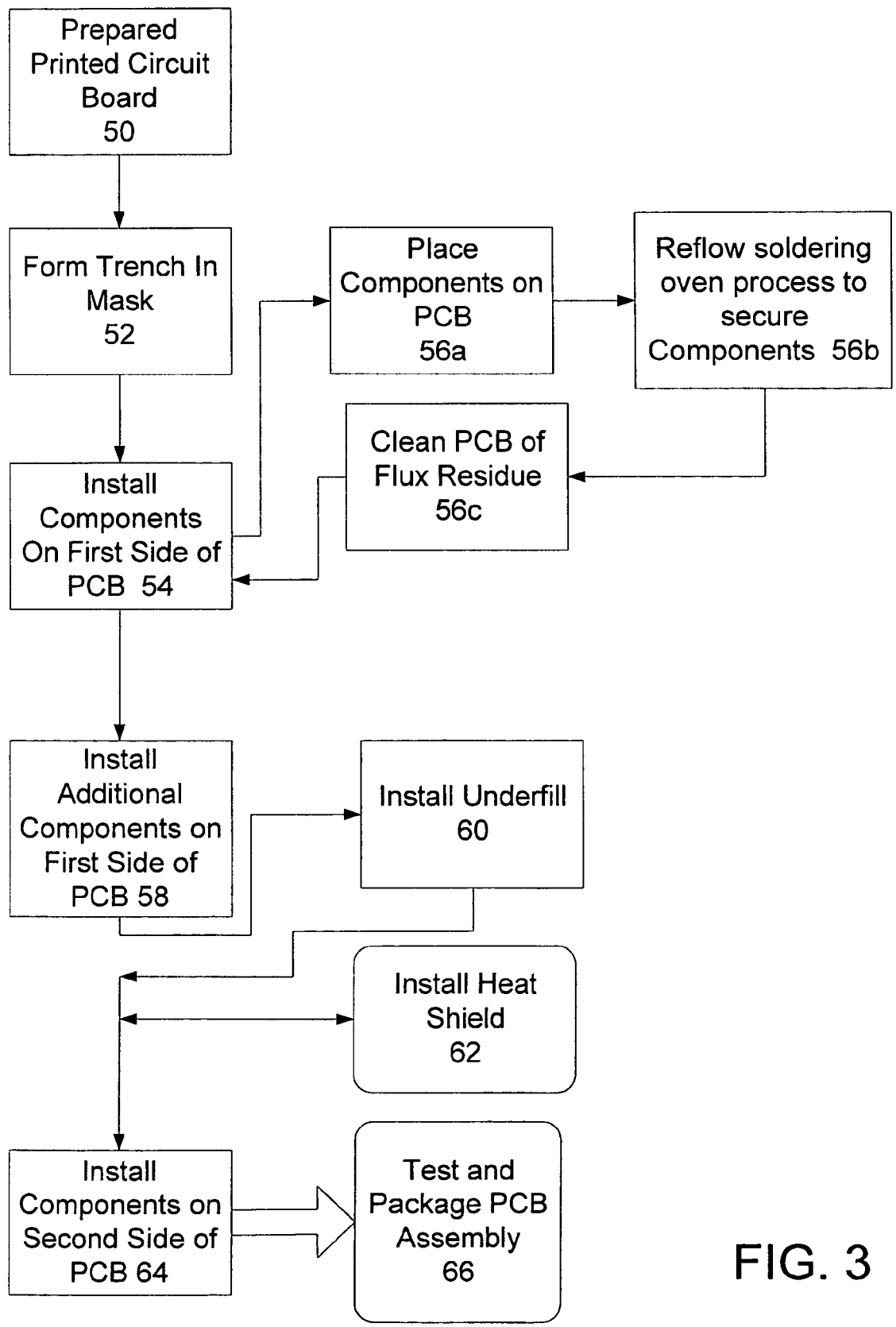
FIG. 3 is a flow chart of the process of the assembly and handling of the printed circuit board assembly.
Figure 4:
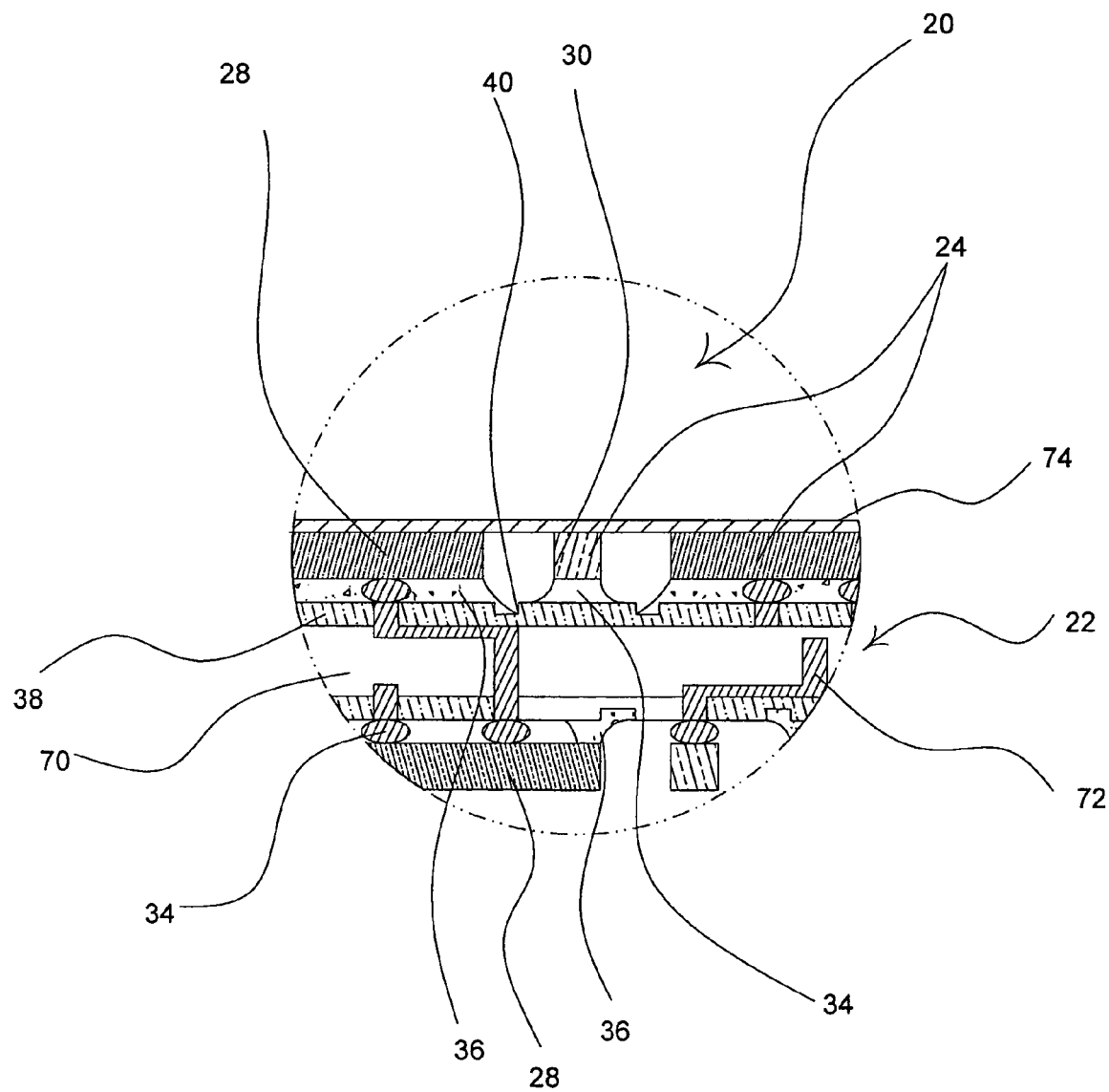
FIG. 4 is an enlarged sectional view of a portion of the printed circuit board assembly taken at section 4 of FIG. 2.

Referring to FIG. 3, a flow chart of the process of manufacturing the printed circuit board assembly (PCBA) 20 of FIGS. 1 and 2, through to the testing and packaging of the PCBA 20 is shown. Block 50 represents providing the printed circuit board (PCB) 22. There are numerous steps in creating a PCB 22 in order to get the conductive paths 72, such as traces and vias, such as seen in FIG. 4, and mounting point, pads 76 such as seen in FIG. 7A, that are used in forming circuitry with the components 24 such as the silicon die 26, the chips 28 and the capacitors 30 of FIG. 1.

In preparing the printed circuit board 22 to receive the components 24 including the chips 28 and the capacitors 30, the manufacturing process has numerous steps before the PCB 22 is ready to receive the components 24.

The printed circuit board 22 has an insulated substrate 70, such as an epoxy-glass composite material, and at least one conductive layer 72, such as copper. The process of preparing the PCB 22 can include drilling holes through the board and plating of the holes between conductive layers, or sides of the printed circuit board 22.

In order to form a circuit pattern on the PCB 22, an imaging process is used to create an image of the circuit pattern. The image covers the portions of the copper where the circuit pattern is not desired. Depending on the process, the image can be a positive or the negative of the desired circuit pattern. An etching or plating process is used to develop an image of the circuit pattern on the printed circuit board. The imaged panels are platted to form a thicker layer of copper for the circuit pattern. A tin plating surface is then plated to the circuitry pattern and holes.

With the circuitry patterns plated with tin, the PCB is immersed in a solution to remove the photo resist that overlies the original copper on the PBC where the circuitry pattern will not exist. This copper is then etched away, with the tin protecting the copper for the circuitry pattern. With that step completed, the tin is chemically stripped to reveal the copper of the circuitry pattern.

A solder mask is applied to the printed circuit board. The mask covers both portions that have the circuitry pattern and interposed non-active portions with the exception of holes and pads where the components are to be connected. This process is sometimes referred to as Solder Mask Over Bare Copper (SMOBC) and is referred to top layer 38 with respect to FIG. 2.

Figure 6:
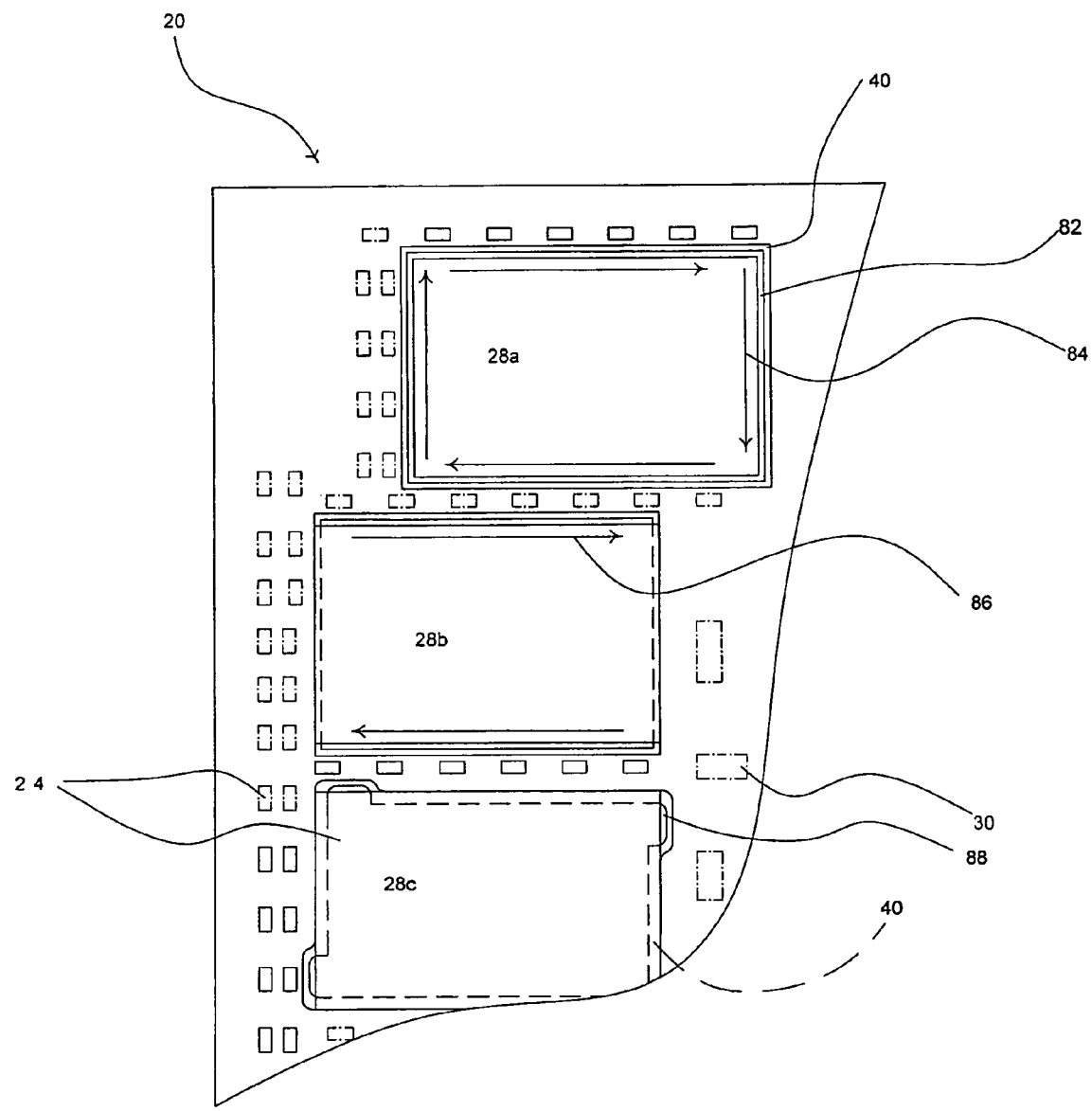
FIG. 6 is a top view of a portion of the printed circuit board assembly represented alternative trench designs and underfill filled patterns.

There can be other steps such a gold plating of contacts, which may or may not be necessary. In addition, there is a step of solder coating where solder is applied to the exposed pads 76, such as seen in FIG. 6, and holes. The excess solder can be removed with a blast of hot air; a method that is called hot air leveling (HAL).

Either during the process of forming the mask over the circuitry pattern and other portions of the PCB, the mask, the top layer 38, can be formed so that it has trenches 40 formed in the mask 38. In the alternative, after the mask 38 is formed, the mask 38 can have a portion removed in portions where trenches 40 are to be formed. Block 52 on FIG. 3 represents the formation of the trenches 40.

The installation of the components 24 on the printed circuit board 22 to form the printed circuit board assembly 20 can be done in various methods. The process described with respect to FIG. 3 is one of many alternative methods of installing components.

In the method described, the chip 26 is installed on the first side of the printed circuit board 22, represented by block 54. Some of the steps of block 54 are spelled out in more detail in blocks 56a-56c. The components 24, such as the silicon die 26 are placed on the printed circuit board 22, as represented by block 56a. The printed circuit board 22 with the component 24 is passed through a reflow soldering oven to melt the solder to form a joint between the component and the PCB 22 therein securing the component 24 to the PCB 22 as represented by block 56b. The PCB 22 with the component 24 is cleaned as represented by block 56c. Methods of cleaning can be such as by a fluorocarbon solvent or de-ionized water and detergent dependent on the flux. An alternative is no cleaning if a non-cleaning flux is use.

Still referring to FIG. 3, block 58 represents the adding of additional components 24 to the printed circuit board (PCB) 22. The component could include chips 28 and capacitors 30. The process could be similar to that described with respect to blocks 56a-56c for block 54. One alternative is using plasma to clean the printed circuit board assembly 20 with plasma. The printed circuit board assembly 20 with the PCB 22 and components 24 can be baked to drive out moisture.

The next step is to place the underfill 36 between selected components 24, such as the chips 28, and the printed circuit board 22. This step is represented by block 60 in FIG. 3.

In the arrangement discussed, a heat shield 74, as seen in FIG. 4, overlies the components 24 and is secured to the printed circuit board. The installation of the heat shield 74 is represented by block 62 in FIG. 3.

In addition to the components 24 located on the first side of the printed circuit board (PCB) 22, the printed circuit board assembly 20 has components 24 located on a second side of the PCB 22. The installation of the components 24 on the second side of the PCB 22 is represented by block 64. In one arrangement, a no-clean flux is used to minimize the chance of moisture being interposed between the heat shield 74 and the components 24.

The testing of the printed circuit board assembly 20 and the packaging of the printed circuit board assembly 20 is represented by block 66 in FIG. 3. With a brief description of the installation of components 24 to the printed circuit board 22, the placement of the underfill 36 will be further described.

Referring to FIG. 4, an enlarged view of a portion of the printed circuit board assembly 20 is shown. The printed circuit board 22 has components 24 including chips 28 and capacitors 30 on both sides of the printed circuit board (PCB) 22. The components 24 are connected to pads 76 on the PCB 22 by solder joints 34. A trench 40 is formed in the top layer 38 of the printed circuit board 22. The trench 40 is interposed between the chips 28 and the capacitors 30.

Still referring to FIG. 4, the heat shield 74 overlies the components 24 on the upper surface of the printed circuit board 22.

Figure 5:
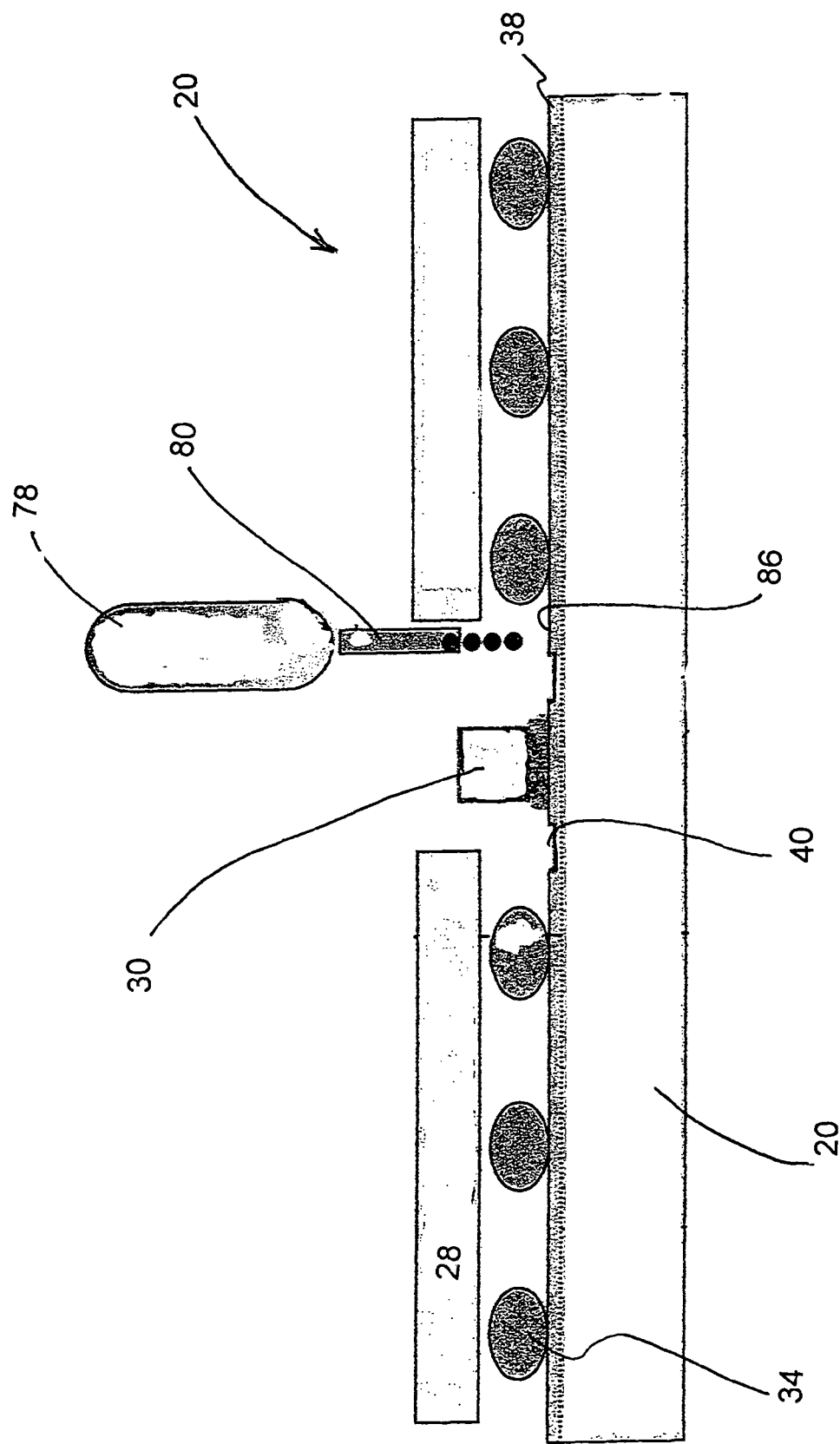
FIG. 5 is a schematic representing the installation of the underflow.

Referring to FIG. 5, a schematic representation of the insertion of the underfill between the chip 28 and the printed circuit board 22 is shown. A dispensing device 78 with a thin needle 80 deposits a layer of underfill material 36, as best seen in FIG. 4, onto the top layer 38 of the printed circuit board 22. Capillary action draws the underfill under the chip 28. The trench 40 in the top layer 38 of the printed circuit board, the mask (SMOG), limits the flow of the underfill into engagement with other components 24 such as the capacitor 30.

Dependent on the size of the chip 28 and the flow rate of the underfill 36 from the dispensing device 78, the underfill 36 can be placed between the chip 28 and the PCB 22 by moving the dispensing device 78 around the chip in a continuous path represented by a series of lines 84 such as in FIG. 6.

FIG. 6 shows three chips 28 that each have different style trenches 40 for limiting the flow of underfill material 36. With respect to chip 28a in FIG. 6 and the chip 28 in FIG. 5, an underfill deposit area 82 is interposed between the foot print of the chip 28 and the trench 40.

Still referring to FIG. 6, the trench 40 underlies the chip 28 on two sides, the left and right side in the center chip 28b in FIG. 6, and just outside of the foot print of the chip 28 on the other two sides, the top and bottom side of the center chip 28 in FIG. 6. The portion of the trench 40 underlying the chip 28 is shown in hidden line. The underfill 36, as best seen in FIG. 4, is dispensed by a path on the upper edge and the lower edge of the chip 28 as represented by the lines 86 in the underfill deposit area 82 interposed between the foot print of the chip 28 and the trench 40.

FIG. 6 also shows a third configuration where the trench 40 is substantially under the footprint of the chip 28c. The trench 40 projects out from under the chip 28c in four corner locations; only three projections 88 of the trench are shown in FIG. 6. The underfill is dispensed at the underfill deposit area 82 at the four corners and the capillary action draws the underfill 36 between the chip 28 and the top layer 38 of the printed circuit board 22.

In addition to different methods of placing the underfill between the chip 28 and the top layer 38 of the PBC 22, the amount of underfill 36 can be varied dependent on if only the periphery of the chip 28 is to be supported or the entire chip 28. For example, referring back to FIG. 4, the chips 28 on the upper side of the PCB 22 show underfill 36 under the entire chip 28. The underfill 36 encapsulates the solder joint 34, whereas the chip 28 underlying the PCB 22 in FIG. 4 has underfill 36 shown only at the periphery of the chip 28.

In one arrangement, the underfill is an epoxy-based with a filler. The amount of filler used influences both the adhesive properties of the underfill and the flow rate of the underfill. The type of underfill used is dependent on several factors including the amount and technique of applying the underfill. For example, if the underfill is to substantially fill the entire area under a chip 28 by capillary action, a low-viscosity underfill would likely be selected. The underfill is drawn by the capillary action wetting both the underside of the chip 28 and the top of the top layer 38. The underfill encapsulates the solder joints 34. The underfill 36 dries and hardens to support the chip 28 therein reducing the stress on the solder joints 34.

In one arrangement, the underfill is cured completely by the heat generated by the installation of the components on the second side of the PCB 22 as represented by block 64 in FIG. 3.

Referring to FIG. 7A and 7B, a portion of a printed circuit board 22 is shown and chip 28 is shown respectively. The printed circuit board 22 has a series of pads 76 which are used in conjunction with the solder joint 34 to electrically connect the components 24, such as the chips 28 and capacitors 30, to the conductive path 72 in the PCB 22 as seen in FIG. 4. In some arrangements, the chip 28, as seen in FIG. 7B, has a plurality of solder bumps 90 and a central region 92 where no solder bumps 90 are located. In this arrangement, a layer of underfill 94 can underlie this central region 92. As part of installing the component to the printed circuit board in one arrangement, a layer of underfill 94 is positioned on the PCB 22 in a region 96 where the center region 92 of the chip will be located. The underfill 94, which in this arrangement is less viscose than the underfill 36 is used in conjunction with the capillary effect described above and below.

Figure 8:
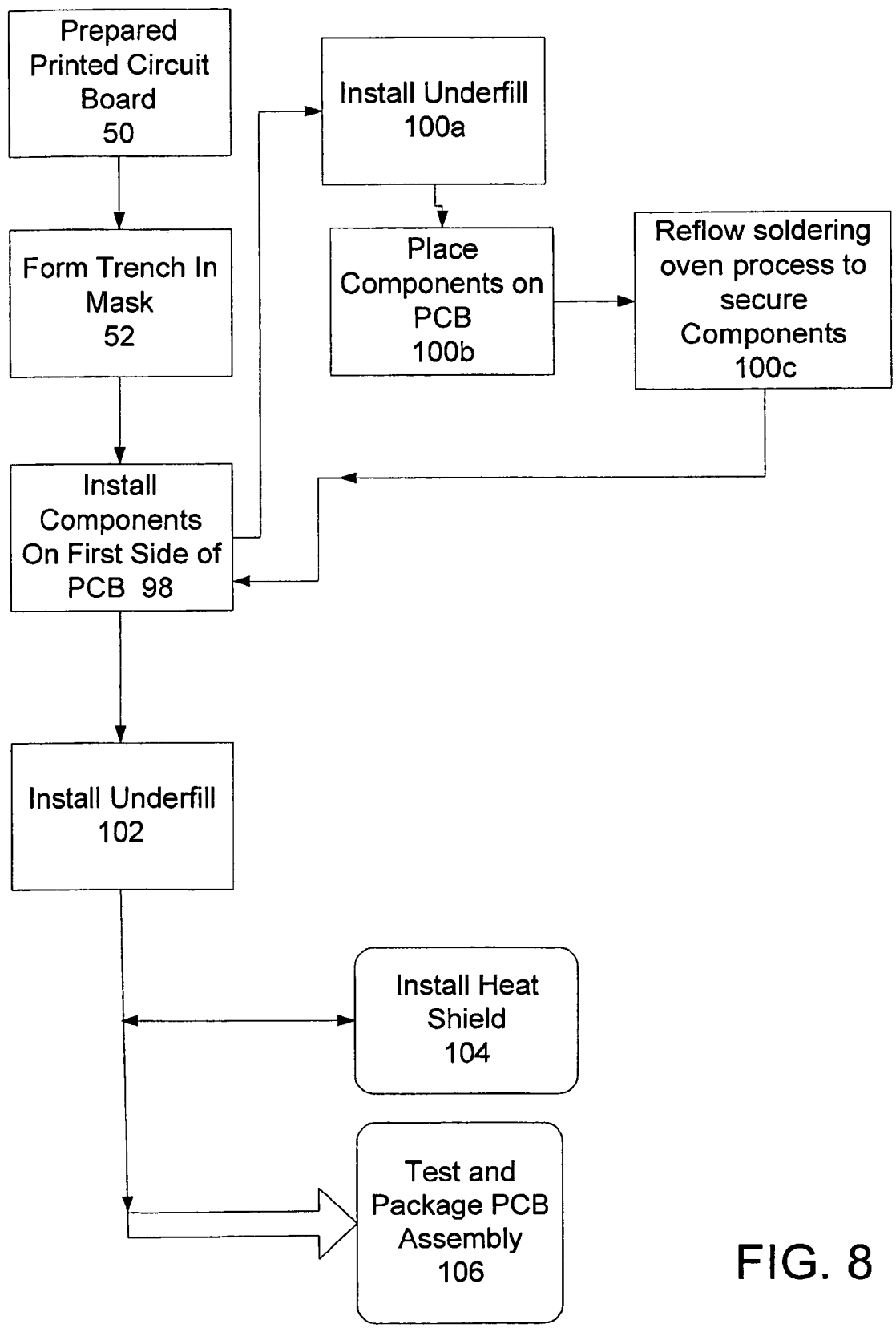
FIG. 8 is a flow chart of an alternative process of the assembly and handling of the printed circuit board assembly.

Referring to FIG. 8, a flow chart of the process of manufacturing the printed circuit board assembly (PCBA) 20 with the PCB 22 of FIG. 7A through to the testing and packaging of the PCBA 20 is shown. Block 50 represents providing the printed circuit board (PCB) 22. There are numerous steps in creating a PCB 22 in order to get the conductive traces and pads that are used in forming circuitry with the components 24 such as the chips 28 of FIG. 7B.

In preparing the printed circuit board 22 to receive the components 24 including the chips 28 and the capacitors 30, the manufacturing process has numerous steps before the PCB 22 is ready to receive the components 24. Most of the steps are not relevant to understanding the need, placement, and method of placement of the underfill 36 or the trench 40.

Either during the process of forming the mask over the circuitry pattern and other portions of the PCB, the mask, the top layer 38, can be formed so that it has trenches 40 formed in the mask 38. In the alternative, after the mask 38 is formed, the mask 38 can have a portion removed in portions where trenches 40 are to be formed. Block 52 on FIG. 8 represents the formation of the trenches 40.

The installation of the components 24 on the printed circuit board 22 to form the printed circuit board assembly 20 can be done in various methods. The process described with respect to FIG. 8 is one of many alternatives.

In the method described, the chip 26 is installed on the first side of the printed circuit board 22 is represented by block 98. Some of the steps of block 98 are spelled out in more detail in blocks 100a-100c. A layer of underfill 94 is placed in certain regions 96 of the PCB 22 as represented by block 100a. The components 24, such as the chips 28, are placed on the printed circuit board 22, as represented by block 100b. The printed circuit board 22 with the component 24 is passed through a reflow soldering oven to melt the solder to form a joint between the component and the PCB 22 therein securing the component 24 to the PCB 22 as represented by block 100c. In the arrangement described, the flux is of the type where no cleaning is required so no block is shown to represent the cleaning.

The next step is to place the underfill 36 between selected components 24, such as the chips 28, and the printed circuit board 22. This step is represented by block 102 in FIG. 8.

In the arrangement discussed, a heat shield 74, as seen in FIG. 4, overlies the components 24 and is secured to the printed circuit board. The installation of the heat shield 74 is represented by block 104 in FIG. 8.

The testing of the printed circuit board assembly 20 and the packaging of the printed circuit board assembly 20 is represented by block 106 in FIG. 8.

The underfill 36 does not encapsulate all of the solder joints 34 as discussed above with respect to the chip 28 on the lower side of the PCB 22 in FIG. 4. Rather the underfill forms a peripheral structure to support the chip and has a "center wall" to assist in the support of the structure.

While this invention has been particularly shown and described with references to preferred embodiments thereof, it will be understood by those skilled in the art that various changes in form and details may be made therein without departing from the spirit and scope of the invention as defined by the appended claims.

For example, the above describes a printed circuit board assembly (PCBA) assembled by a particular method. It is recognized that there are various methods of assembly of the printed circuit board assembly. It is recognized that there are various methods of forming a trench in the printed circuit board. It is also recognized that other methods can be used to limit the flow of the underflow such as rigid formed on the mask.

It is recognized that the device to be mounted, the chip, can include various mountable device. In addition, the printed circuit board can include various substrates to which devices are mounted; the substrates include large scale boards, flip chips and others substrates where the epoxy can be placed. While the arrangement described above discusses the trench 40 in proximity to the chip 28, it is recognized that a trench 40 could be associated with the silicon die 26.

It is also recognized that in addition to increasing the reliability because of thermal stress, the underfill as described above increases the reliability from other issues such as vibration or physical shock.

What is claimed is:

1. A printed circuit board assembly comprising:
   a plurality of electrical components including at least one chip having a foot print, an upper edge, a lower edge and at least one adjacent component;
   a circuit board substrate having a plurality of mounting points, the circuit board substrate configured to receive electrical components from the plurality of electrical components;
   an underfill material interposed between the at least one chip and the circuit board substrate configured to secure the at least one chip to the board substrate, the underfill material drawn between the at least one chip and the circuit board substrate;
   a trench formed in the circuit board substrate, the trench positioned to:
      limit a flow of the underfill such that the underfill does not interact with the at least one adjacent component;
      limit the distribution of the underfill to a continuous path traversing the entire length of the upper edge and a continuous path traversing the entire length of the lower edge of the at least one chip; and
      underlie portions of the at least one chip with at least one underfill receiving portion and extend outward from under the at least one chip; and
   an underfill deposit area interposed between the foot print of the chip and the trench;
   wherein during assembly of the printed circuit board underfill is dispensed at the underfill deposit area and is drawn between the at least one chip and the circuit board substrate; and
   wherein the at least one underfill receiving portion is located within the trench.

2. A printed circuit board assembly of claim 1 wherein the trench formed in the board substrate is positioned to substantially mirror the footprint of the at least one chip.

3. A printed circuit board assembly of claim 1, wherein the trench formed in the circuit board substrate is positioned to underlie the at least one chip on at least two edges of the at least one chip mounted to the circuit board substrate.

4. A printed circuit board assembly of claim 1 wherein the underfill underlies portions of the at least one chip around a circumference of the at least one chip.

5. A printed circuit board assembly of claim 1 further comprising a plurality of solder joints, each of the solder joints interposed between a mounting point in the plurality of mounting points on the circuit board substrate and the at least one chip.

6. A printed circuit board assembly of claim 1, wherein the underfill is an epoxy.

7. A printed circuit board assembly of claim 1 further comprising a heat shield overlying the electrical components.

8. A printed circuit board assembly of claim 1 wherein the underfill is drawn by capillary action from the underfill deposit area between the at least one chip and the circuit board substrate.

9. A printed circuit board assembly of claim 8 wherein the underfill is a low-viscosity underfill.

10. A printed circuit board assembly of claim 8 wherein the underfill is dispensed by a path on the upper edge and the lower edge of the at least one chip.

11. A printed circuit board assembly comprising:
    a plurality of electrical components including at least one chip, the at least one chip having:
       a foot print;
       an upper edge;
       a lower edge; and
       at least one adjacent component;
    a circuit board substrate having a plurality of mounting points, the circuit board substrate configured to receive electrical components from the plurality of electrical components;
    an underfill material interposed between the at least one chip and the circuit board substrate and configured to secure the at least one chip to the board substrate;
    a trench, positioned along at least a portion of the periphery of the chip and formed in the circuit board substrate by a solder mask material, the solder mask material limiting solder flow during performance of a circuit board soldering process at least a portion of the circuit board substrate prior to underfill distribution, the trench positioned to:
       limit a flow of the underfill to a predetermined area such that the underfill does not interact with the at least one adjacent component;
       limit the distribution of the underfill to a continuous path traversing the entire length of the upper edge and a continuous path traversing the entire length of the lower edge of the at least one chip; and
       underlie portions of the chip with at least one underfill receiving portion and extend outward from under the at least one chip; and
    an underfill deposit area interposed between the foot print of the chip and the trench;

wherein the underfill is dispensed, during an assembly of the printed circuit board assembly, at the underfill deposit area;

wherein the underfill material is drawn, by capillary action from the underfill deposit area, between the at least one chip and the circuit board substrate;

wherein the predetermined area is defined by the trench; and wherein the at least one underfill receiving portion is located within the trench.

12. A printed circuit board assembly of claim 11 wherein the underfill is a low-viscosity underfill.

13. A printed circuit board assembly of claim 11 wherein the underfill is dispensed by a path on the upper edge and the lower edge of the at least one chip.

* * * * *